United States Patent
Lambert et al.

(10) Patent No.: US 12,101,913 B2
(45) Date of Patent: Sep. 24, 2024

(54) VARIABLE TOPOGRAPHY HEAT SINK FINS

(71) Applicant: Dell Products L.P., Round Rock, TX (US)

(72) Inventors: Timothy M. Lambert, Austin, TX (US); Eric Michael Tunks, Austin, TX (US); Daniel Alvarado, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 190 days.

(21) Appl. No.: 18/059,577

(22) Filed: Nov. 29, 2022

(65) Prior Publication Data
US 2024/0179874 A1    May 30, 2024

(51) Int. Cl.
  *H05K 7/20*   (2006.01)
  *G06F 1/20*   (2006.01)

(52) U.S. Cl.
  CPC ........... *H05K 7/20509* (2013.01); *G06F 1/20* (2013.01)

(58) Field of Classification Search
  CPC .............................. H05K 7/20509; G06F 1/20
  See application file for complete search history.

(56) References Cited

U.S. PATENT DOCUMENTS

| | | | |
|---|---|---|---|
| 5,602,721 A | 2/1997 | Slade et al. | |
| 5,761,033 A | 6/1998 | Wilhelm | |
| 6,169,660 B1 * | 1/2001 | Sarraf | H01L 23/467 174/16.3 |
| 7,698,095 B2 | 4/2010 | Chung et al. | |
| 7,701,713 B2 | 4/2010 | Li | |
| 8,004,846 B2 * | 8/2011 | Okada | H01L 23/433 361/719 |
| 8,182,319 B2 | 5/2012 | Ong et al. | |
| 8,550,702 B2 | 10/2013 | Campbell et al. | |
| 9,129,958 B2 | 9/2015 | Mallik et al. | |
| 9,237,671 B2 | 1/2016 | Chen et al. | |
| 9,820,411 B2 | 11/2017 | Alshinnawi et al. | |
| 10,123,452 B2 | 11/2018 | Chen et al. | |
| 10,177,107 B2 | 1/2019 | Camarota | |
| 10,274,945 B2 | 4/2019 | Arensmeier et al. | |
| 10,709,032 B1 | 7/2020 | Holyoake et al. | |
| 11,019,748 B2 | 5/2021 | Avvaru et al. | |
| 11,064,808 B2 | 7/2021 | Chen et al. | |
| 11,129,293 B2 | 9/2021 | Wurmfeld | |
| 11,262,809 B2 | 3/2022 | Pham et al. | |
| 11,293,659 B2 | 4/2022 | Brahme et al. | |
| 11,320,164 B2 | 5/2022 | Roth | |

(Continued)

*Primary Examiner* — Jacob R Crum
(74) *Attorney, Agent, or Firm* — Womble Bond Dickinson (US) LLP

(57) ABSTRACT

Methods, systems, and devices for providing computer-implemented services are disclosed. To provide the computer-implemented services, hardware components that generate heat may be used. To manage the heat generated by the hardware components, a heat sink assembly may be used. The heat sink assembly may include features for adjusting its shape and/or size to accommodate other nearby components. By accommodating other components, the heat sink assembly may be used in spaces that would otherwise be unusable for thermal dissipation purposes due to the risk of mechanical interference between the heat sink assembly and the other components.

20 Claims, 10 Drawing Sheets

(56) References Cited

U.S. PATENT DOCUMENTS

| | | |
|---|---|---|
| 2001/0040203 A1 | 11/2001 | Brock et al. |
| 2001/0047858 A1* | 12/2001 | McCullough ....... H01L 23/3672 |
| | | 257/E23.09 |
| 2011/0100668 A1 | 5/2011 | Syed |
| 2011/0228473 A1 | 9/2011 | Anderson et al. |
| 2012/0229971 A1 | 9/2012 | Mills et al. |
| 2014/0334084 A1 | 11/2014 | Fricker |
| 2015/0177750 A1 | 6/2015 | Bailey et al. |
| 2015/0180234 A1 | 6/2015 | Bailey et al. |
| 2015/0289405 A1 | 10/2015 | Stewart et al. |
| 2015/0327394 A1* | 11/2015 | Davis .................. H01L 23/3677 |
| | | 361/720 |
| 2015/0359146 A1 | 12/2015 | Bailey et al. |
| 2016/0044819 A1 | 2/2016 | Bailey et al. |
| 2017/0177007 A1 | 6/2017 | Shelnutt et al. |
| 2017/0181329 A1 | 6/2017 | Shelnutt et al. |
| 2018/0011522 A1 | 1/2018 | Shirakami et al. |
| 2022/0104380 A1 | 3/2022 | Hattangadi et al. |
| 2022/0200250 A1 | 6/2022 | Brooks et al. |

* cited by examiner

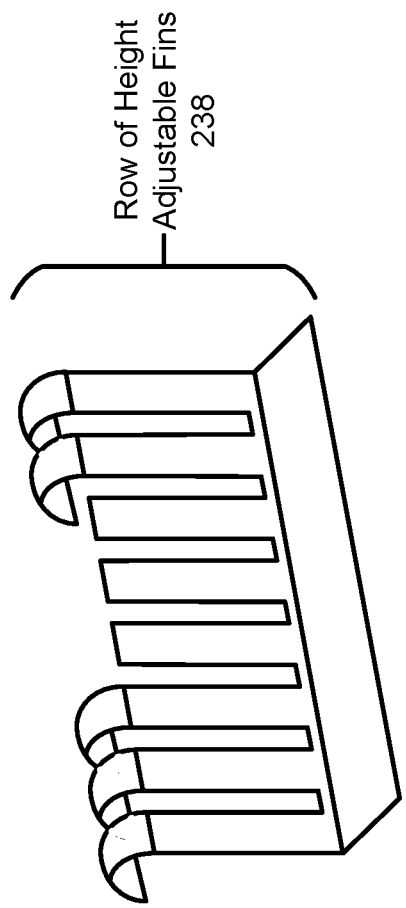

VARIABLE TOPOGRAPHY HEAT SINK FINS

FIELD

Embodiments disclosed herein relate generally to device management. More particularly, embodiments disclosed herein relate to systems and methods to regulate heat from devices in data processing systems.

BACKGROUND

Computing devices may provide computer-implemented services. The computer-implemented services may be used by users of the computing devices and/or devices operably connected to the computing devices. The computer-implemented services may be performed with hardware components such as processors, memory modules, storage devices, and communication devices. The operation of these components may impact the performance of the computer-implemented services.

BRIEF DESCRIPTION OF THE DRAWINGS

Embodiments disclosed herein are illustrated by way of example and not limitation in the figures of the accompanying drawings in which like references indicate similar elements.

FIGS. 2F-2G show diagrams illustrating height adjustable fins in accordance with an embodiment.

DETAILED DESCRIPTION

Figure 1A:
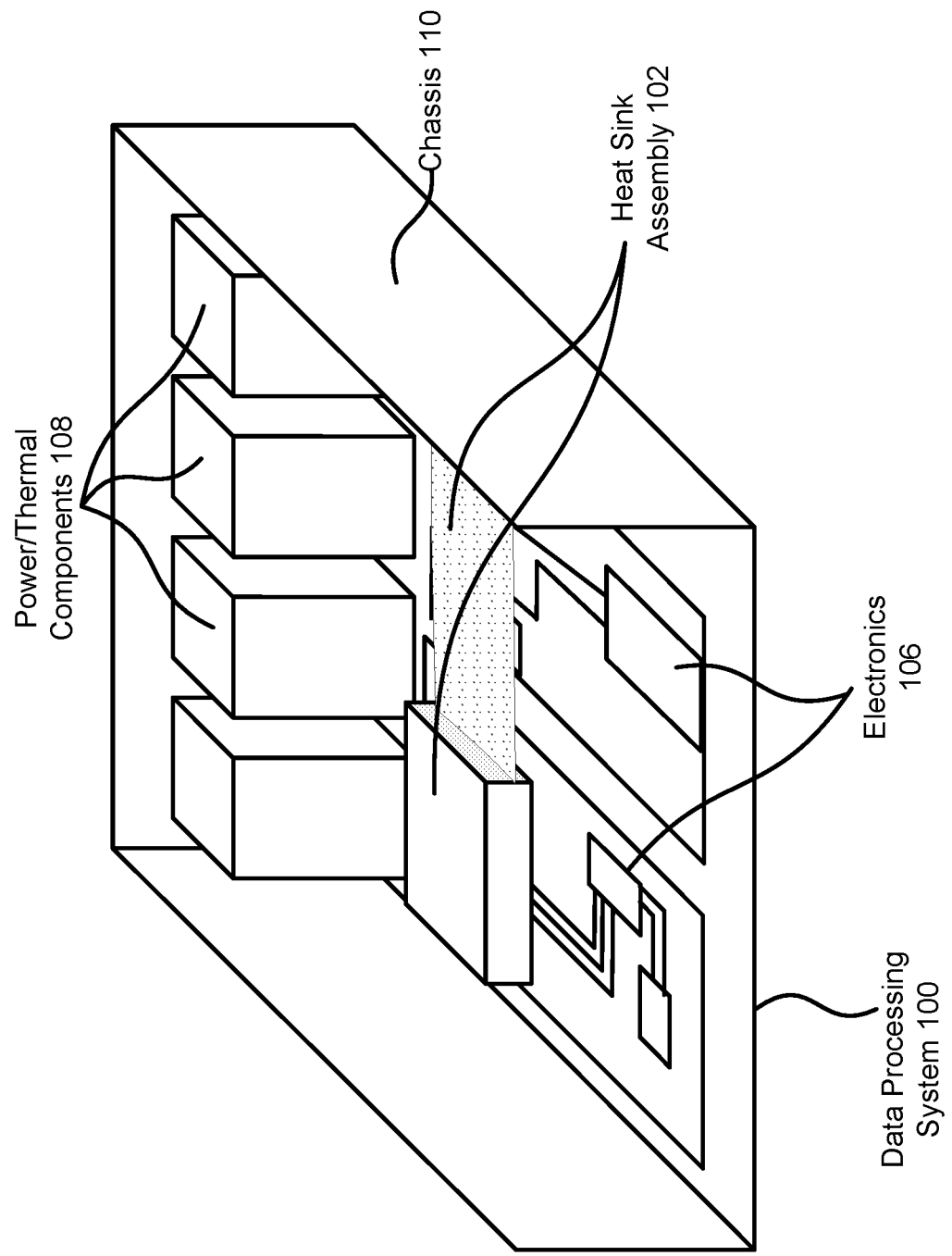
FIGS. 1A-1B show diagrams illustrating a system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

In general, embodiments disclosed herein relate to methods and systems for customizing data processing systems to provide computer-implemented services. The data processing systems may be customized through addition, replacement, and/or removal of hardware components. To provide the computer-implemented services, the data processing systems may be customized to include hardware components for providing the computer-implemented services. These hardware components may generate heat during operation.

In order to manage the heat generated by the hardware components, a hardware component of the hardware components may be customized using a heat sink assembly. The heat sink assembly may include one or more physical features to manage the dissipation of heat from the hardware component. The features may include, for example, height adjustable fins. The height adjustable fins may increase the surface area of the heat sink assembly, increasing the efficiency of the dissipation of heat. The surface area may be increased due to the thermally conductive material of the height adjustable fins making physical contact with the conductive materials of the heat sink assembly. The contact may provide a larger area for dissipation of heat (e.g., by facilitating thermal communication via a thermal conduction path).

While doing so, the height adjustable fins may also physically accommodate hardware components. The height adjustable fins may accommodate the other hardware components by modifying their respective heights to conform to a shape complementary to the other hardware components. By doing so, mechanical interferences between the heat sink assembly and the other components may be resolved without damaging any of the components.

Thus, embodiments disclosed herein may provide an improved heat sink assembly that is less likely to be damaged (and/or less likely to damage components of the data processing systems) due to forces between the components (e.g., which may arise, for example, during reorganization of the components, insertion of the heat sink assembly, etc.). The improved heat sink assembly may also provide for improved thermal dissipation by using otherwise unused space for thermal dissipation purposes.

In an embodiment, a data processing system for providing computer-implemented services using a heat sink assembly is provided. The data processing system may include a hardware component that generates heat while operating; a device positioned proximate to the hardware component; and a heat sink assembly to dissipate the heat generated by the hardware component, the heat sink assembly comprising: a base portion; and an extended portion, the extended portion comprising: a vapor chamber: positioned above the device while the heat sink dissipates the heat, and adapted to condense a vapor used to dissipate the heat; and height adjustable fins: positioned with the vapor chamber to increase a surface area of the vapor chamber, and adapted to conform to a shape of the device.

The base portion of the heat sink assembly may include: a base: positioned with the hardware component and adapted to be in thermal communication with the hardware component via a thermal conduction path; and non-adjustable fins: positioned with the base to increase a surface area of the base and adapted to dissipate heat from the base.

The base may be in fluid communication with the vapor chamber using a conduction tube that connects the base to the vapor chamber, the vapor chamber being offset from the base.

The fluid communication may include a multi-phase loop of heat transfer.

The height adjustable fins may automatically adjust a height of each fin of the height adjustable fins to level the heat sink assembly.

The height of each fin may be based on a force implemented on the heat sink assembly.

The height of each fin may retain a respective maximum height when there is no force implemented on the heat sink assembly.

A shape of the height adjustable fins may include one selected from a group consisting of a pin shape and a plate shape.

At least a portion of the height adjustable fins may be coated in an insulating material to allow mechanical contact between the at least a portion of the height adjustable fins and the hardware resources without making electrical contact.

In an embodiment, the heat sink assembly may be preinstalled on a circuit card.

In an embodiment, a heat sink assembly as discussed above is provided.

Turning to FIG. 1A, a diagram illustrating a system in accordance with an embodiment is shown. The system may provide computer-implemented services. To provide the computer-implemented services, the system may include data processing system 100.

Data processing system 100 may include functionality to provide various types of computer-implemented services. The computer-implemented services may include any number and type of computer-implemented services. The computer-implemented services may include, for example, database services, data processing services, electronic communication services, and/or any other services that may be provided using one or more computing devices. Other types of computer-implemented services may be provided by data processing system 100 without departing from embodiments disclosed herein.

To provide the computer-implemented services, data processing system 100 may include various components including, for example, electronics 106 and power/thermal components 108. The operation of these components may provide all or a portion of the computer-implemented services.

Electronics 106 may include various types of hardware components such as processors (e.g., 107, FIG. 1B), memory modules, storage devices, communications devices, and/or other types of devices. Any of these hardware components may be operably connected to one another using circuit card traces, cabling, connectors, etc. that establish electrical connections used to transmit information between the hardware components.

Power/thermal components 108 may power any of the components of data processing systems 100 and/or thermally manage any of the components of data processing systems 100. For example, power/thermal components 108 may include power supplies, fans, and/or other types of devices usable to power and/or thermally manage the components.

To provide different types of computer-implemented services, various types of computing resources (e.g., provided by hardware devices of electronics 106) may be utilized. Different types of computer-implemented services may use the functionalities of different types of hardware components. For example, database services may use large amounts of the functionality of storage devices while instant communications may use large amounts of the functionality of communication devices such as network interface cards while minimally using the functionality of storage devices. Consequently, it may be desirable to customize the numbers and types of hardware devices of a data processing systems based on the types of computer-implemented services that the data processing system will provide.

During operation, any of the hardware components may generate heat. The heat may, if left unchecked, cause the temperature of one or more of the hardware components to exceed their corresponding thermal operation range (e.g., ranges of temperature in which the hardware components may operate nominally, and outside of which the hardware components may not operate nominally, may fail to operate, may become damaged if operated, etc.).

Additionally, any of the hardware components may need to be replaced due to hardware component failure, to customize the available computing resources, and/or for other purposes.

During customization (e.g., addition, replacement, or removal of the hardware components from the data processing system), the available space within the data processing system may change. This change in space may lead to limitations to what other hardware components may be installed in the data processing system due to the change in space possibly varying in size and shape.

In general, embodiments disclosed herein relate to systems, methods, and devices for thermally managing hardware components while maintaining customizability of the space within data processing systems. The hardware components may be thermally managed to retain their temperatures within their corresponding thermal operating ranges. By doing so, the hardware components may be more likely to operate nominally and provide the computer implemented services of data processing system 100. To do so, data processing system may include heat sink assembly 102. Heat sink assembly 102 may facilitate the dissipation of heat generated from a hardware component of data processing system 100 while also conforming to the size, shape, and placement of adjacent hardware components of data processing systems.

Heat sink assembly 102 may be positioned with the hardware component. When so positioned, heat sink assembly may extract heat from the hardware component and dissipate the heat into the ambient environment.

To improve the rate of heat dissipation, heat sink assembly 102 may have a large shape. The shape may increase the surface area of the heat sink assembly thereby improving the rate of thermal exchange with the ambient environment.

While the shape may improve heat dissipation, it may generally take up more space within chassis 110. Consequently, the shape of heat sink assembly 102 may mechanically interfere with other components positioned in chassis 110.

To reduce the impact of the mechanical inference, the shape of heat sink assembly 102 may be adjustable. The adjustable shape may accommodate other components positioned near heat sink assembly 102. Consequently, the mechanical interference between heat sink assembly 102 and the other components may be mitigated by the adjustable shape.

Figure 1B:
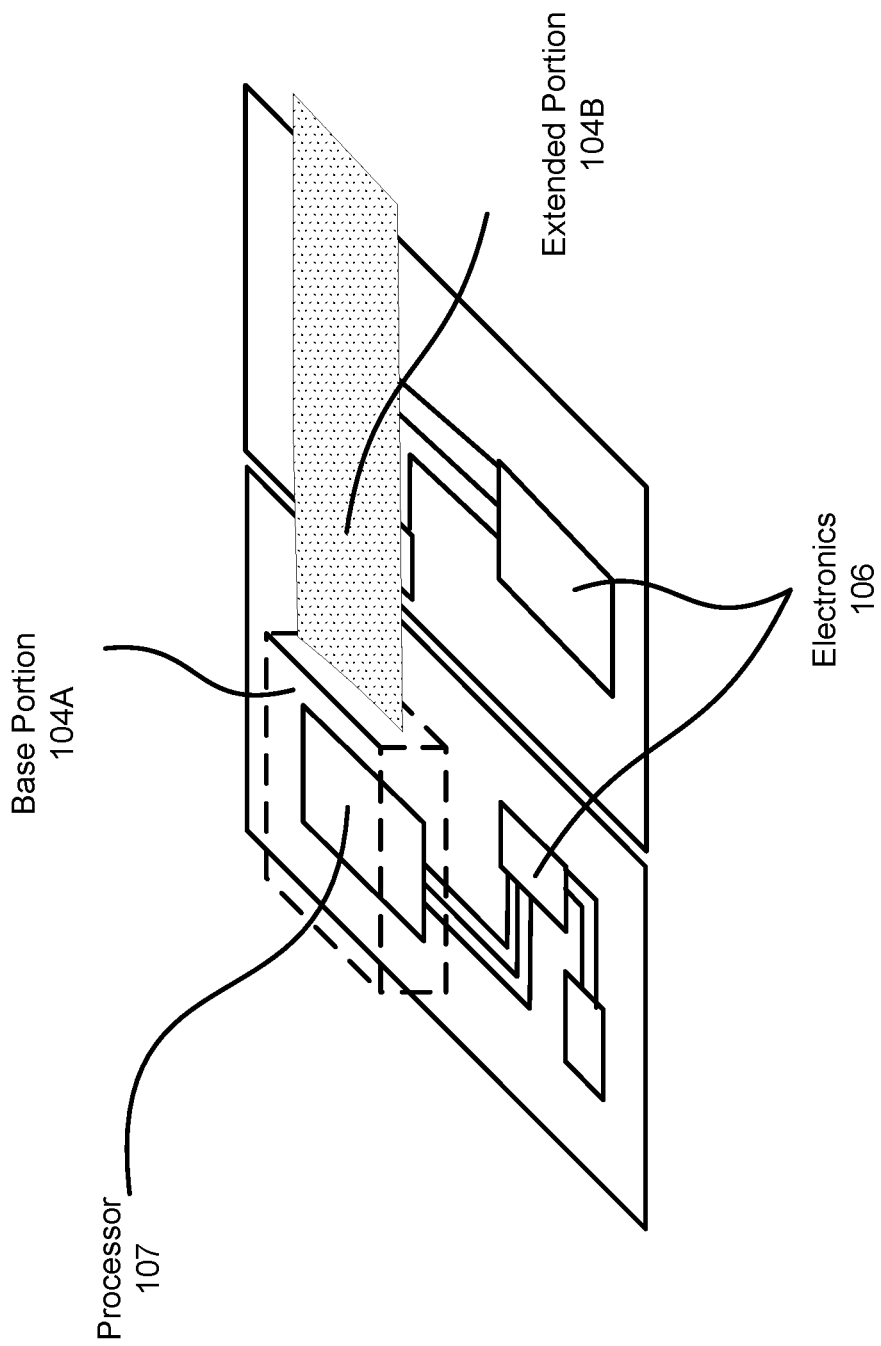

For additional details regarding heat sink assembly 102 and/or hardware components, refer to FIG. 1B.

Any of the components of data processing system 100 may be positioned in chassis 110. Chassis 110 may include an enclosure in which physical structures such as processors, power supplies, and/or other devices may be positioned. Chassis 110 may facilitate placement and management of electronics 106 and/or other components in a computing environment. For example, chassis 110 may be a form factor compliant (e.g., a ½U sled) enclosure usable to integrate data processing system 100 into a high-density computing environment, such as a rack mount chassis management system.

While illustrated in FIG. 1A with a limited number of specific components, a data processing system may include additional, fewer, and/or different components without departing from embodiments disclosed herein.

Turning to FIG. 1B, a diagram showing heat sink assembly 102 and electronics 106 in accordance with an embodiment is shown.

Heat sink assembly 102 may include base portion 104A (drawn without fill and dashed outlining to facilitating visibility of processor 107) and extended portion 104B (drawn as a two-dimensional shape with dotted fill for conciseness, refer to later figures for additional details regarding extended portion 104B). Base portion 104A and extended portion 104B may be in thermal communication with one another. For example, base portion 104A and extended portion 104B may be thermally connected via a conduction and/or convection path. The convection path may be a closed convection path (e.g., in contrast with an open convection path via an ambient environment)

Extended portion 104B may be offset from base portion 104A. Extended portion 104 may be offset from base portion 104 by being positioned above different portions of electronics 106. For example, extended portion 104B may not be positioned above base portion 104A. Rather extended portion 104B may be positioned laterally (e.g., along a circuit card on which electronics 106 are positioned) from base portion 104A.

Base portion 104A may (i) extract heat from a hardware component (e.g., processor 107 in FIG. 1B), (ii) dissipate a first portion of the extracted heat into the ambient environment, and (iii) facilitate transfer of a second portion of the extracted heat to extended portion 104B. Base portion 104A may be in thermal communication with a hardware component (e.g., processor 107, or any other hardware components generating heat while operating) through a thermal conduction path (e.g., physical contact). The thermal conduction path may be maintained by a fastener (not shown). The fastener may include functionality to connect heat sink assembly 102 with processor 107. The fastener may include, for example, clamps, screws, brackets, etc. to keep the base portion 104A in physical contact with processor 107.

Extended portion 104B may (i) obtain heat from other components (e.g., the second portion of heat and/or heat from other components positioned with extended portion 104B), (ii) dissipate the second portion of the extracted heat (e.g., into the ambient environment and/or other components) and/or the heat from other components, (iii) accommodate other components positioned with extended portion 104B, and/or (iv) establish thermal and/or electrical conduction paths to the other components positioned with extended portion 104B.

Thus, a data processing system in accordance with embodiments disclosed herein may have improved customizability (e.g., through accommodation of components) and thermal dissipation capabilities. Refer to FIGS. 2A-2H for additional details regarding heat sink assemblies in accordance with embodiments disclosed herein.

While illustrated in FIG. 1B with a limited number of specific components, a system may include additional, fewer, and/or different components without departing from embodiments disclosed herein.

Figure 2A:
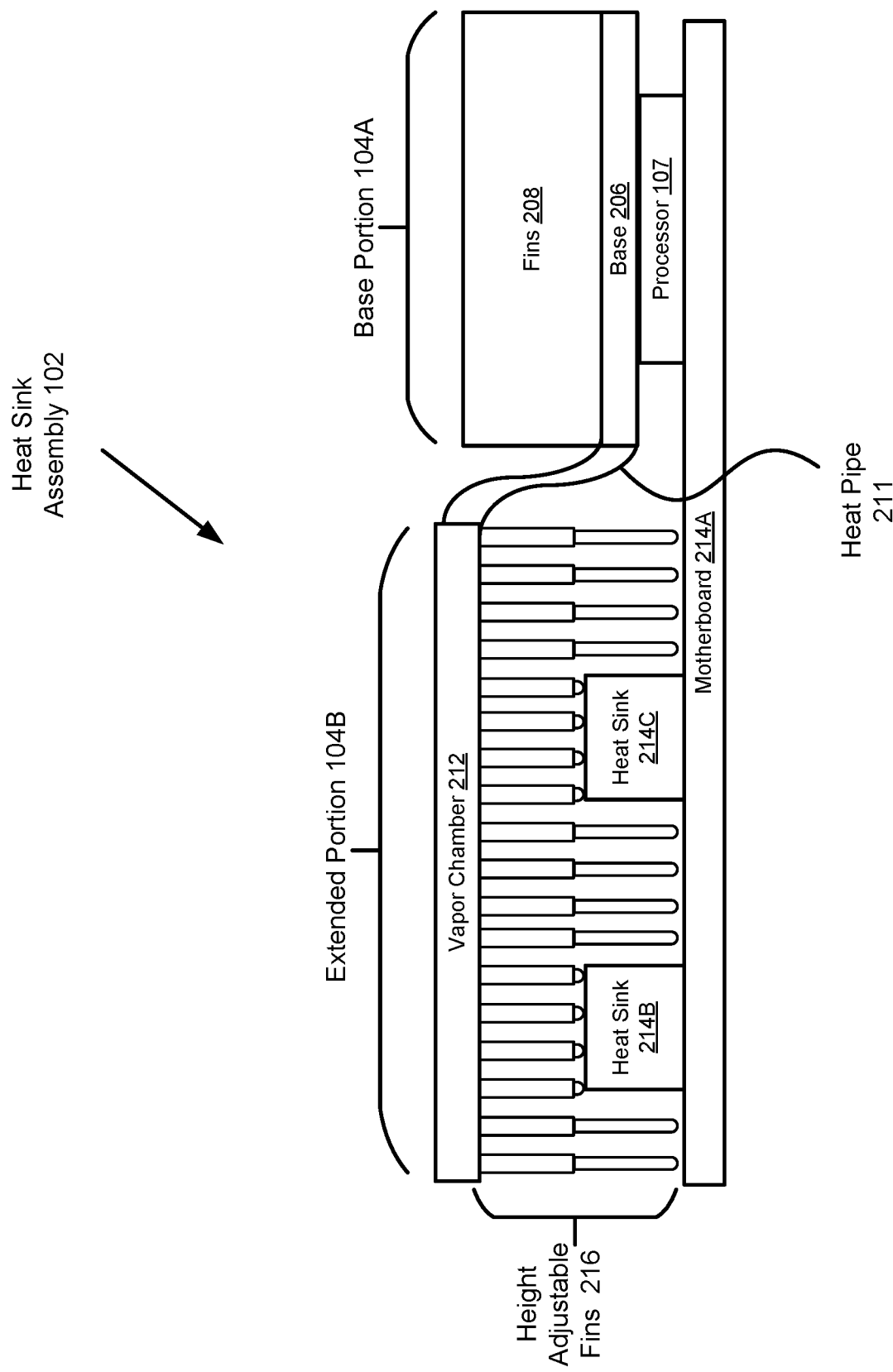
FIGS. 2A-2D show diagrams illustrating a heat sink assembly or portions thereof in accordance with an embodiment.

Turning to FIG. 2A, a diagram illustrating heat sink assembly 102 in accordance with an embodiment is shown. In FIG. 2A, the viewpoint may be from a side of heat sink assembly 102 rather than from a perspective view as shown in FIG. 1B. As discussed above, heat sink assembly 102 may facilitate thermal dissipation for various components.

To dissipate heat, heat sink assembly 102 may be fastened to processor 107 (or other types of hardware components) with a fastener (e.g., not explicitly shown in FIG. 2A). Processor 107 may be securely installed onto motherboard 214A to allow processor 107 to provide its functionality while a host data processing system is operating. For example, motherboard 214A may operably connect electronics 106 and/or power/thermal components 108 discussed with respect to FIGS. 1A-1B.

While illustrated in FIG. 2A with an example topology, a motherboard (e.g., 214A) may include different types and/or arrangements of hardware components (e.g., processor 107, heat sink 214B-214C, etc.), and/or different interconnection topologies facilitated by motherboard 214A without departing from embodiments disclosed herein.

To provide its functionality, heat sink assembly 102 may include base portion 104A, extended portion 104B, and heat pipe 211. Each of these portions is discussed below.

Base portion 104A may include base 206 and fins 208. Each of these components is discussed below.

Base 206 may be adapted to be in thermal communication with processor 107 (e.g., the hardware component) via a thermal conduction path. This thermal conduction path may be maintained by the fastener that keeps the heat sink assembly (more specifically, base 206) in physical contact (directly or indirectly) with processor 107.

For example, processor 107 may generate heat while operating. The heat may move from processor 107 to base 206 as the heat moves from a high temperature area to a lower temperature area. This movement of heat (e.g., thermal communication) may cause the dissipation of heat from processor 107.

Base 206 may be in thermal communication with the extended portion 104B (more specifically, vapor chamber 212) using heat pipe 211. Heat pipe 211 may connect the base 206 to the extended portion 104B (e.g., via fluid communication and/or physical connection). To do so, base 206 (and/or a portion of heat pipe 211 in base 206) may include a liquid capable of carrying heat generated from processor 107 to vapor chamber 212. The liquid, when combined with enough heat, may change phases (e.g., the liquid may become a vapor) and travel up and through the heat pipe 211 to vapor chamber 212, discussed below. This phase change of the liquid during heat transfer may be a part of a multi-phase loop of heat transfer.

Base 206 may be implemented, for example, using a thermally conductive material (e.g., aluminum) having a shape that facilitates placement of base 206 on processor 107. The shape may include, for example, recesses and/or other features to facilitate connection of base 206 and heat pipe 211.

Fins 208 (e.g., non-adjustable fins) may be adapted to dissipate at least a portion of the heat from base 206. To do so, fins 208 may be positioned to increase the surface area of the base 206. The increased surface area may facilitate heat dissipation by heat sink assembly 102.

Fins 208 may be implemented, for example, using a thermally conductive material (e.g., aluminum) having a shape that facilitates thermal exchange with gasses in an ambient environment. For example, fins 208 may be shaped as fins, pins, spike, rods, and/or other shapes that may have a large surface area to volume ratio. Fins 208 may be attached to base 206.

Extended portion 104B may include vapor chamber 212 and height adjustable fins 216. Each of these components is discussed below.

Vapor chamber 212 may be adapted to condense the vapor that travels though heat pipe 211 from base 206. The vapor may distribute the heat throughout vapor chamber 212. As heat dissipates from vapor chamber 212, the vapor may cool to a lower temperature causing another phase change back to liquid. The liquid may then travel back through (e.g., due to gravity, internal slopes of the vapor chamber, wicking material, etc.) heat pipe 211 to base 206 where the liquid may absorb more heat and continue the multi-phase heat transfer loop.

Vapor chamber 212 may be implemented, for example, using a thermally conductive material (e.g., aluminum) having an internal hollow portion to accommodate vapor and liquid from base 206.

Height adjustable fins 216 may be adapted to (i) dissipate heat from vapor chamber 212 (e.g., received from base 206) and (ii) accommodate other components. To do so, height adjustable fins 216 may be (i) positioned to increase the surface area of vapor chamber 212 to facilitate heat dissipation, (ii) be in thermal communication with vapor chamber 212, and (iii) have adjustable shapes to accommodate other components (e.g., such as heat sinks 214B-214C, and/or other types of hardware components such as chips, discrete components such resistors/capacitors/inductors/transformers/etc.).

Height adjustable fins 216 may be implemented, for example, using a thermally conductive material (e.g., aluminum) shaped as pins, fins, or other high surface area structures. The height adjustable fins 216 may also include adjustment mechanisms that allow for the shapes of the height adjustable fins 216 to be changed. The adjustment mechanisms may be reversible or permanent.

Figure 2B:
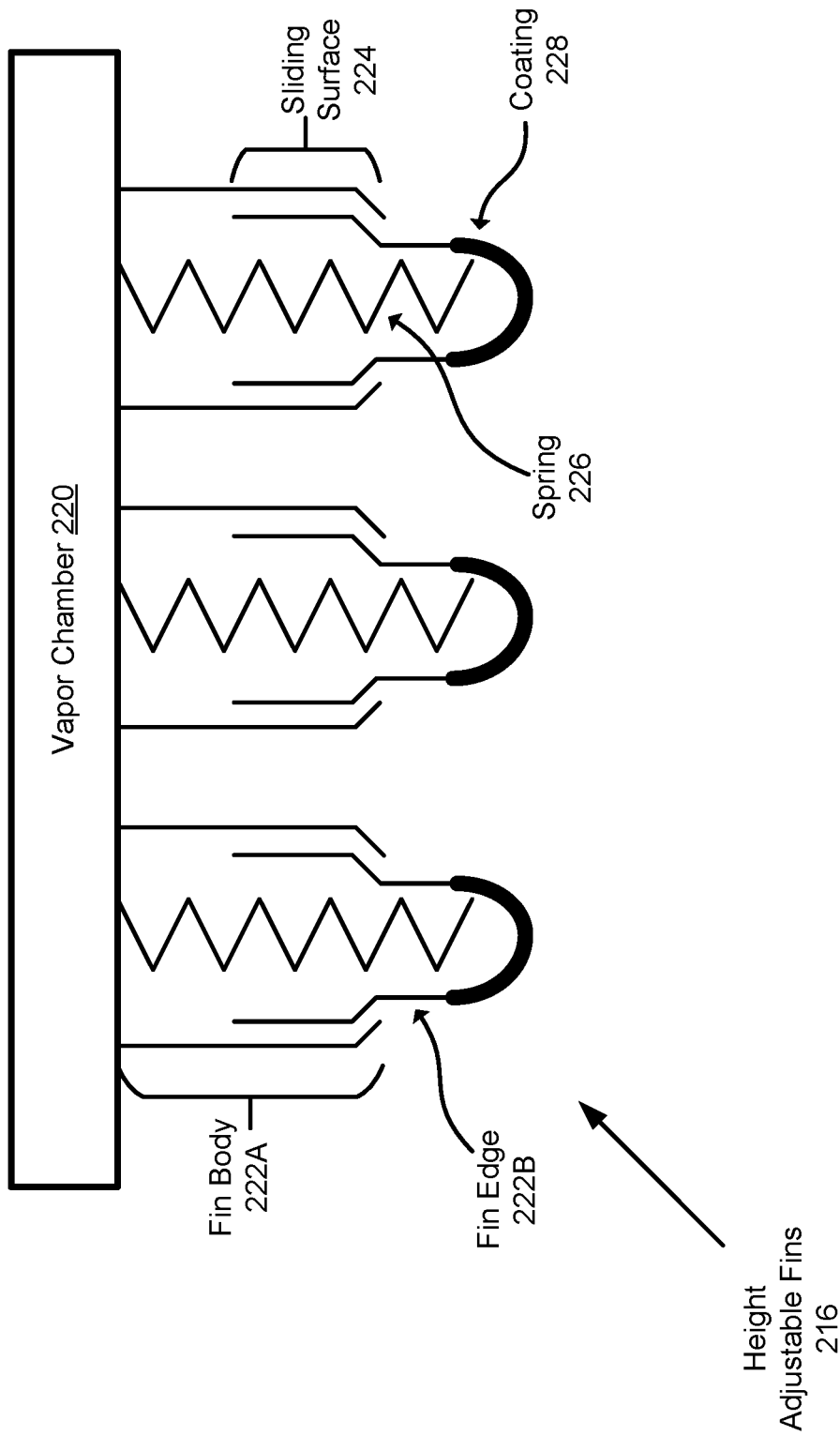

For example, a reversible adjustment mechanism may allow the shape of a height adjustable fin to revert back to an initial shape after being adjusted. Refer to FIG. 2B for additional details regarding reversible adjustment mechanisms.

In another example, a permanent adjustment mechanism may not allow the shape of a height adjustable fin to revert back to an initial shape after being adjusted. Refer to FIGS. 2G-2H for additional details regarding permanent adjustment mechanisms.

Either of adjustment mechanism may allow height adjustable fins 216 to accommodate various components (e.g., heat sinks 214B, other components). Consequently, while positioned with these components, extended portion 104B may not establish mechanical interferences with these other components.

While illustrated in FIG. 2A with a limited number of specific components, a heat sink assembly may include additional, fewer, and/or different components without departing from embodiments disclosed herein.

As discussed above, heat sink assemblies may include height adjustable fins. FIGS. 2B-2E illustrate examples of height adjustable fins 216 in accordance with an embodiment. For conciseness and clarity, various examples of these structures are shown in these figures but are not exclusive. Height adjustable fins in accordance with embodiments may have different shapes and/or structures without departing from embodiments disclosed herein.

Turning to FIG. 2B, a diagram of height adjustable fins 216 positioned on vapor chamber 220 in accordance with an embodiment is shown. As discussed above, heat sink assembly 102 may include height adjustable fins 216 that may conform to various shapes and sizes of hardware components. To do so, each of height adjustable fins 216 may include fin body 222A and fin edge 222B. Each of these components of height adjustable fins 216 is discussed below.

Fin body 222A may be positioned with vapor chamber 220 (e.g., vapor chamber 212 from FIG. 2A) to allow thermal communication between height adjustable fins 216 and vapor chamber 220 (e.g., via physical contact).

Fin body 222A may be implemented with, for example, a thermally conductive material such as aluminum, brass, bronze, copper, etc. Fin body 222A may be tubular shaped and may include a hollow region in which a retention mechanism (e.g., spring 226) may be positioned. Fin body 222A may include a stop or other structure for retaining fin edge 222B with fin body 222A (e.g., even when fin edge 222B is actuated by the retention mechanism).

Fin edge 222B may be positioned on an end of fin body 222A opposite to vapor chamber 220. Fin edge 222B may be (slidably) attached to fin body 222A. The height of adjustable fins 216 may be modified by siding fin edge 222B with respect to fin body 222A across sliding surface 224 (e.g., between fin edge 222B and fin body 222A). For example, sliding surface 224 may permit the fin edge 222B to move in and out of (a hollow portion of) fin body 222A.

Fin edge 222B may be implemented with, for example, a thermally conductive material such as aluminum, brass, bronze, copper, etc. Fin edge 222B may be pin or fin shaped (refer to FIG. 2D for additional details regarding fin shaped fin edges) and may include coating 228. Coating 228 may thermally insulate and/or electrically insulate fin edge 222B and/or fin body 222A from structures which may contact fin edge 222B (e.g., heat sink 214B shown in FIG. 2A). For example, coating 228 may be implemented with a dielectric or other material. Coating 228 may be applied by, for example, dip coating, spray coating, etc.

Spring 226 (e.g., a retention mechanism) may be positioned inside a height adjustable fin of the height adjustable fins 216 (e.g., between body 222A and edge 222B). Spring 226 may be adapted to automatically adjust a height of each height adjustable fin to accommodate other components.

For example, when not positioned near other components, spring 226 may cause each of the height adjustable fins to extend to a maximum height (e.g., because no counter force is placed against the force applied by spring 226). However, when positioned near other components, 226 may compress due to force applied by other components thereby reducing the height of the height adjustable fins to accommodate the other components.

While coating 228 has been described as insulating, in an embodiment, coating 228 is not present (e.g., thereby allowing the formation of thermal and/or electrical conduction paths) and/or is only thermally or electrically insulating thereby allowing for selective formation of thermal or electrical conduction paths while being thermally or electrically insulating. Additionally, it will be appreciated that any of the height adjustable fins may or may not include coating 228 thereby establishing a heterogenous array of height adjustable fins.

Although illustrated and described with respect to spring 226 in FIG. 2B, a retention mechanism of the height adjustable fins may be implemented using other types of structures without departing from embodiments disclosed herein.

While height adjustable fins have been illustrated as being pin shaped, e.g., in FIG. 2B, height adjustable fins in accordance with embodiments may have other shapes.

Figure 2C:
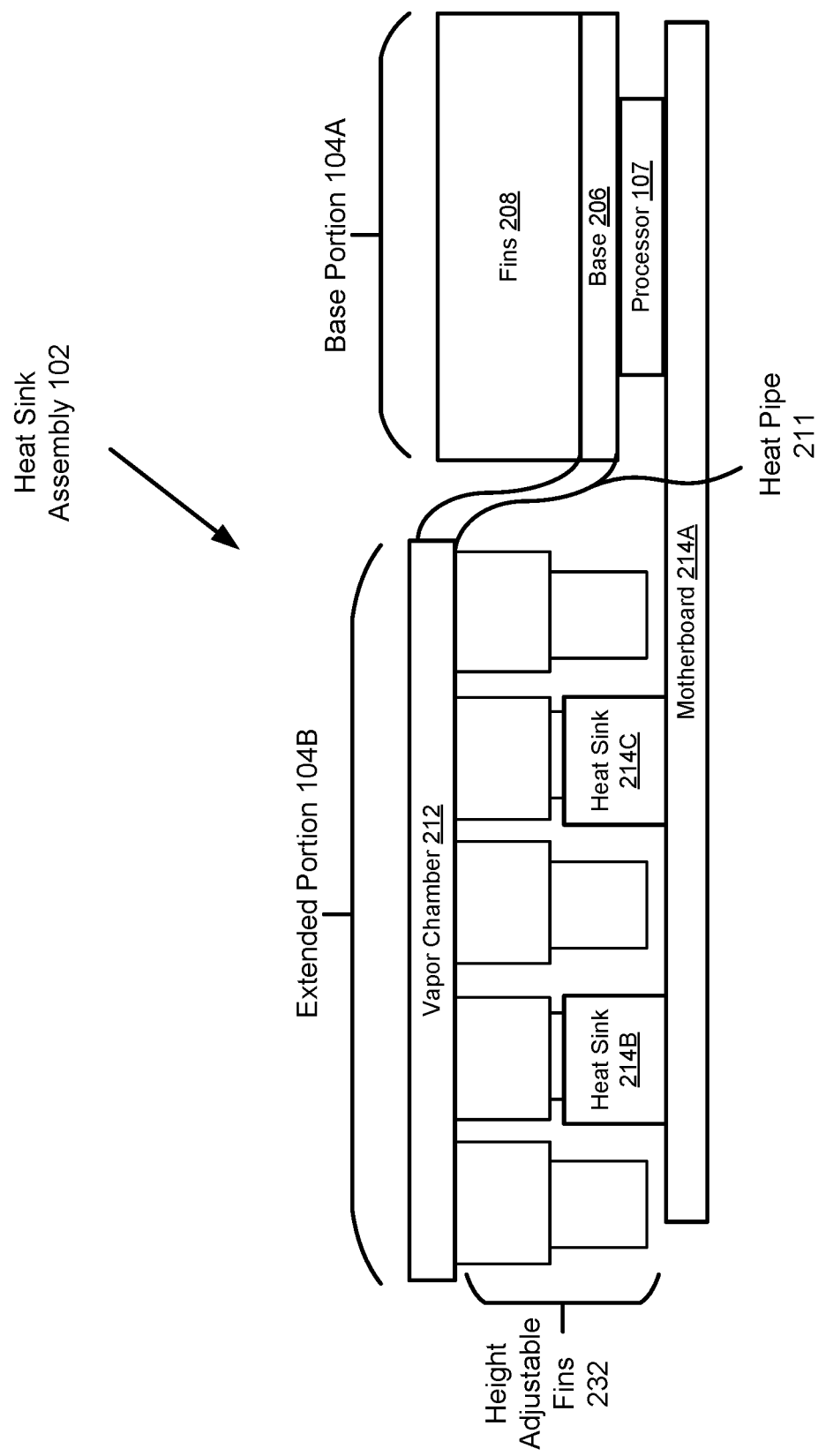

Turning to FIG. 2C, a diagram of heat sink assembly 102 in accordance with an embodiment is shown. As see in FIG. 2C, in contrast to FIG. 2A, heat sink assembly 102 may include height adjustable fins 232 that have a different shape from height adjustable fins 216.

For example, height adjustable fins 232 may be oblong in at least one dimension thereby resulting in a fin like appearance that breaks symmetry of height adjustable fins 232.

In an embodiment, height adjustable fins 232 include a portion shaped as flat, square or rectangular plates instead of the pin shape of height adjustable fins 216. For example, a plate shaped height adjustable fin of height adjustable fins 232 may provide its functionality just as a height adjustable fin of the height adjustable fins 216 may provide its functionality, discussed previously.

While described with respect to plate like shapes, height adjustable fins may have other shapes such as, for example, a cube shape, cone shape, cylinder shape, and/or any other shapes without departing from embodiments disclosed herein.

Although illustrated as a singular row of height adjustable fins in FIG. 2C, height adjustable fins may have a topology in which each height adjustable fin in the row may also be in a column of height adjustable fins (e.g., which may form a regular or irregular grid of fins).

Figure 2D:
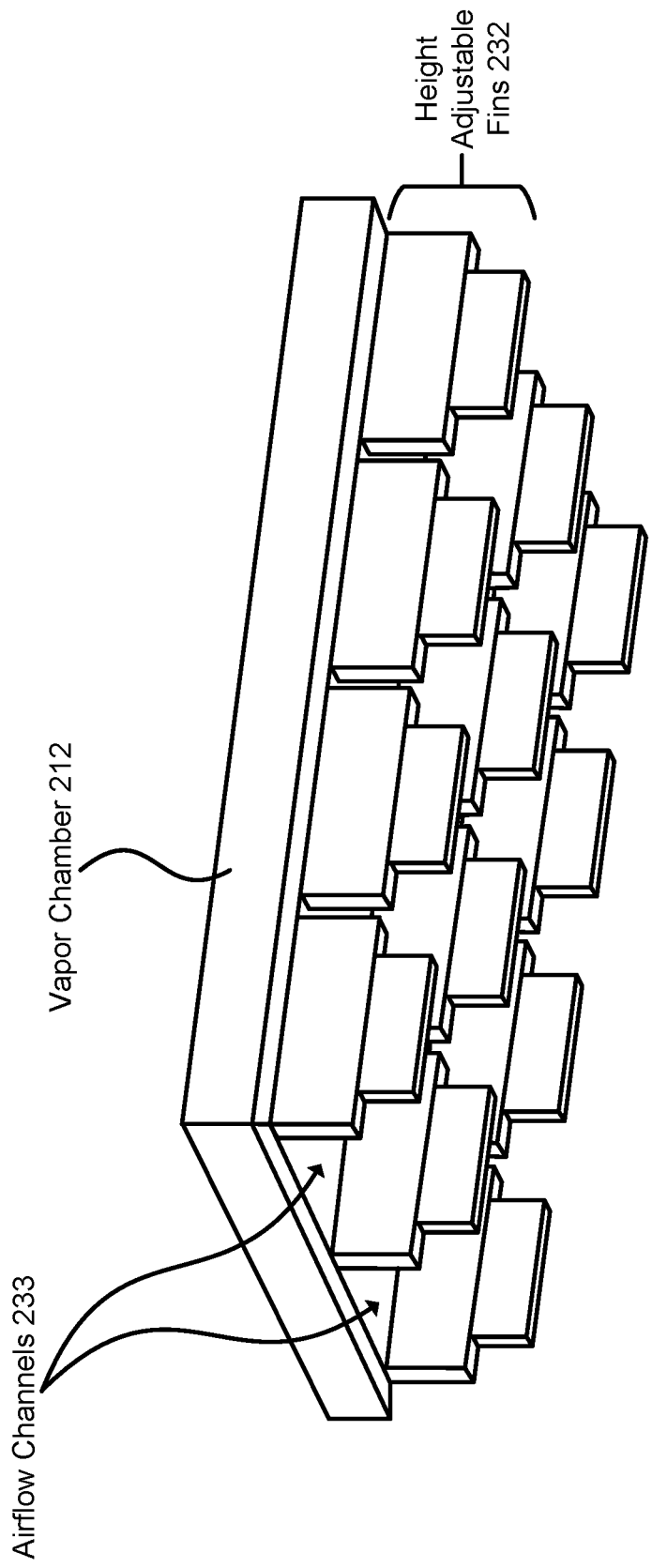

Turning to FIG. 2D, a diagram of height adjustable fins 232 in accordance with an embodiment is shown. As seen in FIG. 2D, height adjustable fins 232 may be positioned on vapor chamber 212 in a grid that results in the formation of airflow channels 233 between height adjustable fins 232. The airflow channels may allow for airflow between height adjustable fins that facilitates dissipation of heat from all of height adjustable fins 232.

While illustrated as positioned on a single side of vapor chamber 212, height adjustable fins may be positioned on multiple surfaces of vapor chamber 212.

Figure 2E:
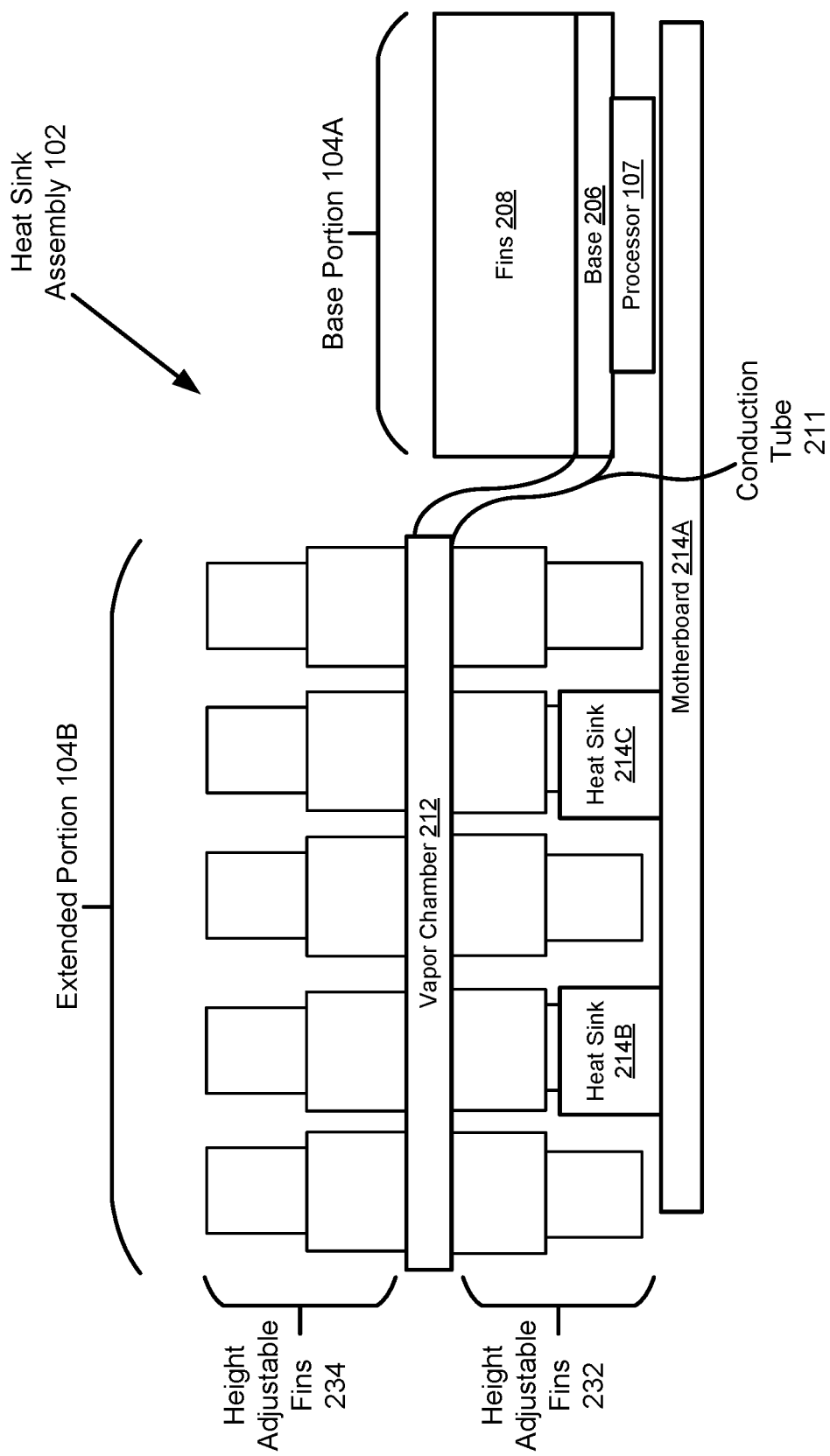
FIG. 2E shows a diagram illustrating a heat sink assembly in accordance with an embodiment.

Turning to FIG. 2E, a diagram of heat sink assembly 102 in accordance with an embodiment is shown. As seen in FIG. 2E, height adjustable fins 232 may extend towards motherboard 214A, and may conform to the size a shape of components positioned on motherboard 214A (e.g., 214B-214C). In addition to height adjustable fins 232, heat sink assembly 102 may include height adjustable fins 234. Height adjustable fins 234 may be similar to height adjustable fins 232 but may be positioned on a different surface of vapor chamber 212. For example, height adjustable fins 234 may be positioned on an opposite surface to the surface on which height adjustable fins 232 are positioned. Height adjustable fins 234 may, consequently, extend away from both vapor chamber 212 and motherboard 214A (e.g., towards something above these components, which may be a cover of a chassis, another mechanical component, a thermal component, a power distribution component, and/or other types of components.

Consequently, height adjustable fins 232, 234 of heat sink assembly 102 may allow for heat sink assembly 102 to conform its shape to components positioned above and/or below vapor chamber 212. Therefore, various thermal conduction and/or electrical conduction paths between vapor chamber 212 (and/or components positioned thereon) and other components (e.g., heat sinks, enclosure components such as lids, etc.) may be established.

By doing so, heat sink assembly 102 may facilitate installation of and/or accommodate for components that are placed above or below heat sink assembly 102. When doing so, height adjustable fins 234 may conform to the size and shape of the other components.

Returning to the discussion of the height adjustable mechanism (discussed with respect to FIG. 2B), the height adjustable mechanism may further include a feature that permits a portion of a height adjustable fin of the height adjustable fins to break off from the heat sink assembly.

Figure 2F:
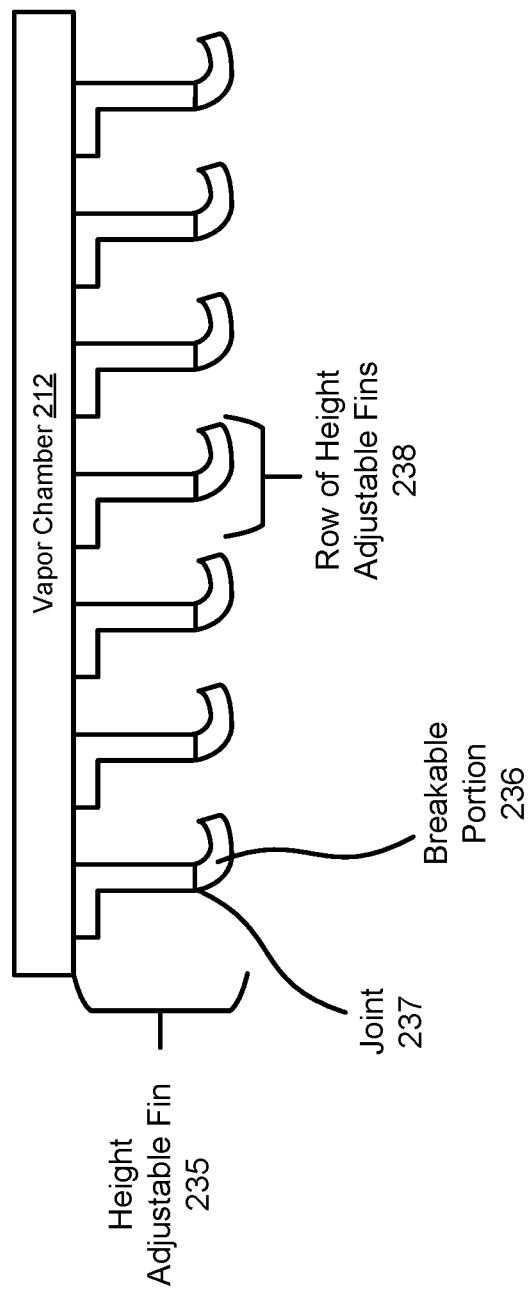

As discussed above, height adjustable fins may either be reversibly adjustable in height or permanently adjustable in height. FIGS. 2F-2G show diagrams of permanent height adjustable fins in accordance with an embodiment.

Turning to FIG. 2F, a diagram of height adjustable fins (e.g., 235) in accordance with an embodiment is shown. Height adjustable fins (e.g., 235) may operate similarly to and/or perform a similar function to height adjustable fins 232, 234, discussed above. However, in contrast to height adjustable fins 232, 234, height adjustable fins (e.g., 235) may be permanent in height adjustment. In other words, once the height of height adjustable fins (e.g., 235) is adjusted, the height may not be reverted.

To provide for height adjustment, instead of a spring-based adjustment mechanism as described with respect to the reversible height adjustable fins, height adjustable fins (e.g., 235) may include breakable portions (e.g., 236) usable to permanently reduce the height of the height adjustable fins (e.g., 235). When actuated (e.g., along a joint or other structure), breakable portions (e.g., 236) may disengage from the remainder of an adjustable height fin thereby reducing the height of adjustable height fin. While illustrated in FIG. 2F with respect to a single joint (e.g., 237), it will be appreciated that an adjustable height fin may include any number of joints and any number of breakable portions thereby allowing for multiple degree of height adjustment (e.g., by disengaging along various joints).

While described with respect to breakable portions and joints, in an embodiment, a height adjustable fin includes at least one bendable portion. For example, a bendable portion may include a joint that facilitates bending of the bendable portion about the joint. The bending of the bendable portion may allow for height adjustment without disengagement of the bendable portion.

In an embodiment, height adjustable fins (e.g., 235) are implemented using a flexible metal (e.g., a beryllium copper fin).

Turning to FIG. 2G, a diagram of a row of height adjustable fins 238 in accordance with an embodiment is shown. As seen in FIG. 2G, a portion of the height adjustable fins in the row have been permanently adjusted by breaking away breakable portions of the height adjustable fins. Consequently, when positioned near other components, the reduced height of these fins may accommodate the shapes of the other, nearby components.

Figure 3:
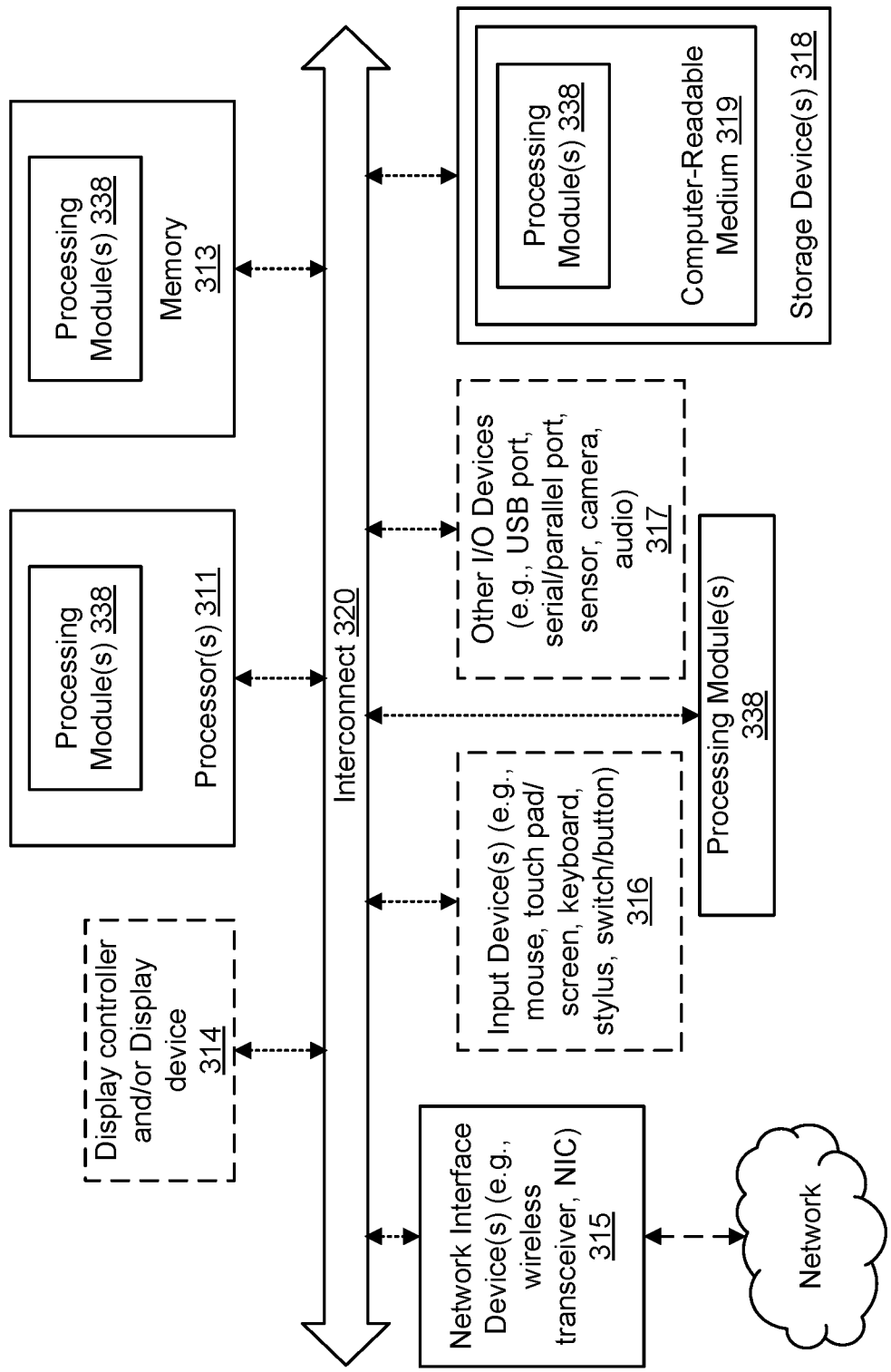
FIG. 3 shows a block diagram illustrating a data processing system in accordance with an embodiment.

Any of the components illustrated in FIGS. 1A-2G may be implemented with one or more computing devices. Turning to FIG. 3, a block diagram illustrating an example of a data processing system (e.g., a computing device) in accordance with an embodiment is shown. For example, system 310 may represent any of data processing systems described above performing any of the processes or methods described above. System 310 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 310 is intended to show a high-level view of many components of the computer system. However, it is to be understood that additional components may be present in certain implementations and furthermore, different arrangement of the components shown may occur in other implementations. System 310 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 310 includes processor 311, memory 313, and devices 315-317 via a bus or an interconnect 320. Processor 311 may represent a single processor or multiple processors with a single processor core or multiple processor cores included therein. Processor 311 may represent one or more general-purpose processors such as a microprocessor, a central processing unit (CPU), or the like. More particularly, processor 311 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 311 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 311, which may be a low power multi-core processor socket such as an ultra-low voltage processor, may act as a main processing unit and central hub for communication with the various components of the system. Such processor can be implemented as a system on chip (SoC). Processor 311 is configured to execute instructions for performing the operations discussed herein. System 310 may further include a graphics interface that communicates with optional graphics subsystem 314, which may include a display controller, a graphics processor, and/or a display device.

Processor 311 may communicate with memory 313, which in one embodiment can be implemented via multiple memory devices to provide for a given amount of system memory. Memory 313 may include one or more volatile storage (or memory) devices such as random-access memory (RAM), dynamic RAM (DRAM), synchronous DRAM (SDRAM), static RAM (SRAM), or other types of storage devices. Memory 313 may store information including sequences of instructions that are executed by processor 311, or any other device. For example, executable code and/or data of a variety of operating systems, device drivers, firmware (e.g., input output basic system or BIOS), and/or applications can be loaded in memory 313 and executed by processor 311. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 310 may further include IO devices such as devices (e.g., 315, 315, 317, 318) including network interface device(s) 315, optional input device(s) 315, and other optional IO device(s) 317. Network interface device(s) 315 may include a wireless transceiver and/or a network interface card (NIC). The wireless transceiver may be a Wi-Fi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 315 may include a mouse, a touch pad, a touch sensitive screen (which may be integrated with a display device of optional graphics subsystem 314), a pointer device such as a stylus, and/or a keyboard (e.g., physical keyboard or a virtual keyboard displayed as part of a touch sensitive screen). For example, input device(s) 315 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity data collector arrays or other elements for determining one or more points of contact with the touch screen.

IO devices 317 may include an audio device. An audio device may include a speaker and/or a microphone to facilitate voice-enabled functions, such as voice recognition, voice replication, digital recording, and/or telephony functions. Other IO devices 317 may further include universal serial bus (USB) port(s), parallel port(s), serial port(s), a printer, a network interface, a bus bridge (e.g., a PCI-PCI bridge), data collector(s) (e.g., a motion data collector such as an accelerometer, gyroscope, a magnetometer, a light data collector, compass, a proximity data collector, etc.), or a combination thereof. IO device(s) 317 may further include an imaging processing subsystem (e.g., a camera), which may include an optical data collector, such as a charged coupled device (CCD) or a complementary metal-oxide semiconductor (CMOS) optical data collector, utilized to facilitate camera functions, such as recording photographs and video clips. Certain data collectors may be coupled to interconnect 320 via a data collector hub (not shown), while other devices such as a keyboard or thermal data collector may be controlled by an embedded controller (not shown), dependent upon the specific configuration or design of system 310.

To provide for persistent storage of information such as data, applications, one or more operating systems and so forth, a mass storage (not shown) may also couple to processor 311. In various embodiments, to enable a thinner and lighter system design as well as to improve system responsiveness, this mass storage may be implemented via a solid-state device (SSD). However, in other embodiments, the mass storage may primarily be implemented using a hard disk drive (HDD) with a smaller amount of SSD storage to act as an SSD cache to enable non-volatile storage of context state and other such information during power down events so that a fast power up can occur on re-initiation of system activities. Also, a flash device may be coupled to processor 311, e.g., via a serial peripheral interface (SPI). This flash device may provide for non-volatile storage of system software, including a basic input/output software (BIOS) as well as other firmware of the system.

Storage device 318 may include computer-readable storage medium 319 (also known as a machine-readable storage medium or a computer-readable medium) on which is stored one or more sets of instructions or software (e.g., processing module, unit, and/or processing module/unit/logic 338) embodying any one or more of the methodologies or functions described herein. Processing module/unit/logic 338 may represent any of the components described above. Processing module/unit/logic 338 may also reside, completely or at least partially, within memory 313 and/or within processor 311 during execution thereof by system 310, memory 313 and processor 311 also constituting machine-accessible storage media. Processing module/unit/logic 338 may further be transmitted or received over a network via network interface device(s) 315.

Computer-readable storage medium 319 may also be used to store some software functionalities described above persistently. While computer-readable storage medium 319 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of embodiments disclosed herein. The term "computer-readable storage medium" shall accordingly be taken to include, but not be limited to, solid-state memories, and optical and magnetic media, or any other non-transitory machine-readable medium.

Processing module/unit/logic 338, components and other features described herein can be implemented as discrete hardware components or integrated in the functionality of hardware components such as ASICS, FPGAs, DSPs or similar devices. In addition, processing module/unit/logic 338 can be implemented as firmware or functional circuitry within hardware devices. Further, processing module/unit/logic 338 can be implemented in any combination hardware devices and software components.

Note that while system 310 is illustrated with various components of a data processing system, it is not intended to represent any particular architecture or manner of interconnecting the components as such details are not germane to embodiments disclosed herein. It will also be appreciated that network computers, handheld computers, mobile phones, servers, and/or other data processing systems which have fewer components, or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. A data processing system for providing computer-implemented services, comprising:
   a hardware component that generates heat while operating;
   a device positioned proximate to the hardware component; and
   a heat sink assembly to dissipate the heat generated by the hardware component, the heat sink assembly comprising:
      a base portion, and
      an extended portion, the extended portion comprising:
         a vapor chamber:
            positioned above the device while the heat sink assembly dissipates the heat,
            adapted to condense a vapor used to dissipate the heat, and
         height adjustable fins:
            positioned with the vapor chamber to increase a surface area of the vapor chamber,
            adapted to conform to a shape of the device.

2. The data processing system of claim 1, wherein the base portion of the heat sink assembly comprises:
   a base:
      positioned with the hardware component, and
      adapted to be in thermal communication with the hardware component via a thermal conduction path; and
   non-adjustable fins:
      positioned with the base to increase a surface area of the base, and
      adapted to dissipate heat from the base.

3. The data processing system of claim 2, wherein the base is in fluid communication with the vapor chamber using a conduction tube that connects the base to the vapor chamber, the vapor chamber being offset from the base.

4. The data processing system of claim 3, wherein the fluid communication comprises a multi-phase loop of heat transfer.

5. The data processing system of claim 1, wherein the height adjustable fins automatically adjust a height of each fin of the height adjustable fins to level the heat sink assembly.

6. The data processing system of claim 5, wherein the height of each height adjustable fin is based on a force implemented on the heat sink assembly.

7. The data processing system of claim 6, wherein the height of each height adjustable fin retains a respective maximum height when there is no force implemented on the heat sink assembly.

8. The data processing system of claim 7, wherein a shape of the height adjustable fins comprises one selected from a group consisting of a pin shape, a plate shape, and a cube shape.

9. The data processing system of claim 8, wherein at least a portion of the height adjustable fins may be coated in an insulating material to allow mechanical contact between the height adjustable fins and the device without making electrical contact.

10. The data processing system of claim 1, wherein the heat sink assembly is preinstalled on a circuit card.

11. A heat sink assembly comprising:
a base portion, and
an extended portion, the extended portion comprising:
  a vapor chamber:
    positioned above a device, positioned proximate to a hardware component that generates heat while operating, while the heat sink assembly dissipates the heat,
    adapted to condense a vapor used to dissipate the heat, and
  height adjustable fins:
    positioned with the vapor chamber to increase a surface area of the vapor chamber,
    adapted to conform to a shape of the device.

12. The heat sink assembly of claim 11, wherein the base portion of the heat sink assembly comprises:
a base:
  positioned with the hardware component, and
  adapted to be in thermal communication with the hardware component via a thermal conduction path; and
non-adjustable fins:
  positioned with the base to increase a surface area of the base, and
  adapted to dissipate heat from the base.

13. The heat sink assembly of claim 12, wherein the base is in fluid communication with the vapor chamber using a conduction tube that connects the base to the vapor chamber, the vapor chamber being offset from the base.

14. The heat sink assembly of claim 13, wherein the fluid communication comprises a multi-phase loop of heat transfer.

15. The heat sink assembly of claim 11, wherein the height adjustable fins automatically adjust a height of each fin of the height adjustable fins to level the heat sink assembly.

16. The heat sink assembly of claim 15, wherein the height of each height adjustable fin is based on a force implemented on the heat sink assembly.

17. The heat sink assembly of claim 16, wherein the height of each height adjustable fin retains a respective maximum height when there is no force implemented on the heat sink assembly.

18. The heat sink assembly of claim 17, wherein a shape of the height adjustable fins comprises one selected from a group consisting of a pin shape, a plate shape, and a cube shape.

19. The heat sink assembly of claim 18, wherein at least a portion of the height adjustable fins may be coated in an insulating material to allow mechanical contact between the height adjustable fins and the device without making electrical contact.

20. The heat sink assembly of claim 11, wherein the heat sink assembly is preinstalled on a circuit card.

* * * * *